(12) United States Patent
Baik et al.

(10) Patent No.: US 10,559,634 B2
(45) Date of Patent: Feb. 11, 2020

(54) ORGANIC LIGHT EMITTING DIODE DISPLAY DEVICE AND METHOD OF MANUFACTURING THE SAME

(71) Applicant: LG DISPLAY CO., LTD., Seoul (KR)

(72) Inventors: Seungmin Baik, Paju-si (KR); Hojin Kim, Paju-si (KR); Goeun Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/049,515

(22) Filed: Jul. 30, 2018

(65) Prior Publication Data

US 2019/0067392 A1    Feb. 28, 2019

(30) Foreign Application Priority Data

Aug. 25, 2017 (KR) .................. 10-2017-0107934

(51) Int. Cl.
| | |
|---|---|
| *H01L 27/32* | (2006.01) |
| *H01L 51/50* | (2006.01) |
| *H01L 51/56* | (2006.01) |
| *G09G 3/3291* | (2016.01) |
| *H01L 51/52* | (2006.01) |

(52) U.S. Cl.
CPC ....... *H01L 27/3246* (2013.01); *G09G 3/3291* (2013.01); *H01L 27/3209* (2013.01); *H01L 27/3258* (2013.01); *H01L 51/5012* (2013.01); *H01L 51/5218* (2013.01); *H01L 51/5234* (2013.01); *H01L 51/56* (2013.01); *G09G 2300/0439* (2013.01); *G09G 2300/0819* (2013.01)

(58) Field of Classification Search
USPC .......... 257/20, 194, 135–136, 213–413, 900, 257/902–903; 438/297, 203, 318, 312, 438/339, 309
See application file for complete search history.

(56) References Cited

U.S. PATENT DOCUMENTS

2017/0250233 A1* 8/2017 Ushikubo ........... H01L 27/3246

FOREIGN PATENT DOCUMENTS

KR    10-2010-0066221 A    6/2010

* cited by examiner

*Primary Examiner* — Moin M Rahman
(74) *Attorney, Agent, or Firm* — Birch, Stewart, Kolasch & Birch, LLP

(57) ABSTRACT

An organic light emitting diode display device can include a substrate; a plurality of pixels disposed on the substrate; a plurality of anodes corresponding to the plurality of pixels, respectively; an organic light emitting layer disposed on the plurality of anodes; a cathode layer disposed on the organic light emitting layer; and a step difference compensation layer partitioning at least two adjacent pixels among the plurality of pixels, in which the step difference compensation layer includes a base layer, and a plurality of spike patterns disposed on the base layer, the plurality of spike patterns including protrusions that extend into at least a portion of the organic light emitting layer in a region between the at least two adjacent pixels.

15 Claims, 14 Drawing Sheets

<Anode Damage by Etching Solution>

<Change in Surface Morphology by Anode Damage>

(a)

(b)

<Spike Shape>

ORGANIC LIGHT EMITTING DIODE DISPLAY DEVICE AND METHOD OF MANUFACTURING THE SAME

CROSS-REFERENCE TO RELATED APPLICATIONS

This application claims the priority benefit of Korean Patent Application No. 10-2017-0107934 filed in the Republic of Korea on Aug. 25, 2017, the entire contents of which is incorporated herein by reference for all purposes as if fully set forth herein.

BACKGROUND OF THE INVENTION

Field of the Invention

The present disclosure relates to an organic light emitting diode display device and a method of manufacturing the same.

Discussion of the Related Art

Various display devices capable of reducing weight and volume, which are disadvantages of cathode ray tubes, have been developed. The display devices can be implemented as a liquid crystal display (LCD), a field emission display (FED), a plasma display panel (PDP), an electroluminescent display, an organic light emitting diode display device, and the like.

Among these display devices, the organic light emitting diode display device is a self-emission type display device which excites an organic compound to emit light. The organic light emitting diode display device has advantages of being light and thin with a simplified design because the backlight that is used in the LCD is not required. In addition, the organic light emitting diode display device is widely used because it has good characteristics such as low-temperature production, high response speed (e.g., less than 1 ms), low power consumption, wide viewing angle and high contrast.

The organic light emitting diode display device includes an organic light emitting diode (OLED) for converting electrical energy into light energy. The organic light emitting diode includes an anode, a cathode, and an organic light emitting layer disposed therebetween. In the organic light emitting diode display device, holes and electrons injected from the anode and the cathode, respectively, are combined in the organic light emitting layer to form excitons. The formed excitons emit light while falling from an excited state to a ground state and display an image.

In recent years, there is an increasing demand for a high-resolution organic light emitting diode display device having a high pixel per inch (PPI). In order to implement the high-resolution organic light emitting diode display device having the high PPI, since a large number of pixels must be arranged on a display panel having a limited area, a distance between the pixels becomes relatively narrow. In this instance, a leakage current can occur between neighboring pixels, and unwanted pixels may emit light due to the leakage current, which can degrade display quality.

SUMMARY OF THE INVENTION

The present disclosure provides an organic light emitting diode display device having improved display quality by minimizing a leakage current and a method of manufacturing the same.

According to an embodiment of the present disclosure, an organic light emitting diode display device can include a substrate; a plurality of pixels disposed on the substrate; a plurality of anodes corresponding to the plurality of pixels, respectively; an organic light emitting layer disposed on the plurality of anodes; a cathode layer disposed on the organic light emitting layer; and a step difference compensation layer partitioning at least two adjacent pixels among the plurality of pixels, in which the step difference compensation layer includes a base layer, and a plurality of spike patterns disposed on the base layer, the plurality of spike patterns including protrusions that extend into at least a portion of the organic light emitting layer in a region between the at least two adjacent pixels.

An aspect of an embodiment of the present disclosure is that the plurality of spiked patterns are configured to block leakage current from flowing between the at least two adjacent pixels.

Another aspect of an embodiment of the present disclosure is that each of the protrusions in the plurality of spike patterns is finger shaped or villus shaped.

Another aspect of an embodiment of the present disclosure is that the protrusions in the step difference compensation layer are spaced apart from each other by a distance greater than or equal to approximately 100 nm.

Another aspect of an embodiment of the present disclosure is that the organic light emitting layer includes a plurality of layers, and at least one of the protrusions pierces though at least one layer of organic light emitting layer.

According to an embodiment of the present disclosure, an upper portion of the organic light emitting layer remains connected across the at least two adjacent pixels.

Another aspect of an embodiment of the present disclosure is that the step difference compensation layer has an irregular surface or an upper surface of the step difference compensation layer has a concave-convex structure.

According to an embodiment of the present disclosure, the step difference compensation layer is disposed between two adjacent anodes among the plurality of anodes. Also, upper surfaces of the plurality of spike patterns can be substantially flush with upper surfaces of the two adjacent anodes.

Another aspect of an embodiment of the present disclosure is that the plurality of spike patterns protrude farther than upper surfaces of the two adjacent anodes in a direction toward the organic light emitting layer.

According to an embodiment of the present disclosure, the organic light emitting diode display device further includes a charge generation layer included in the organic light emitting layer, in which the charge generation layer is disposed on the plurality of spiked patterns, and the charge generation layer has a wavy surface in the region between the at least two adjacent pixels or at least one of the protrusions pierces through the charge generation layer in the region between the at least two adjacent pixels.

Another aspect of an embodiment of the present disclosure is that the step difference compensation layer includes a mixture of at least two materials having different etch rates. Also, the mixture can include a binder and an additive, in which the binder is acryl-based or epoxy-based, and the additive includes an organic material that is lactam-based, and the additive in the step difference compensation layer includes a black pigment.

Another aspect of an embodiment of the present disclosure is that the step difference compensation layer is disposed between two adjacent anodes among the plurality of anodes without overlapping an upper surface of the two adjacent anodes.

Another aspect of an embodiment of the present disclosure is that the organic light emitting layer has a uniform thickness across the plurality of anodes.

Another aspect of an embodiment of the present disclosure is that portions of the organic light emitting layer are embedded between the protrusions in the plurality of spike patterns.

According to another embodiment of the present disclosure, organic light emitting diode display device can include a plurality of pixels; and a step difference compensation layer partitioning at least two adjacent pixels among the plurality of pixels, in which the step difference compensation layer includes a plurality of spike patterns including protrusions in a region between the at least two adjacent pixels, and the step difference compensation layer includes a mixture of at least two materials having different etch rates.

An aspect of an embodiment of the present disclosure is that that organic light emitting diode display device can further include an organic light emitting layer including a plurality of layers, in which at least one of the protrusions pierces though at least one layer of organic light emitting layer, and an upper portion of the organic light emitting layer remains connected across the at least two adjacent pixels.

According to another embodiment of the present disclosure, a method of manufacturing an organic light emitting diode display device can include forming a layer of conductive material on a substrate; patterning the layer of conductive material to form a plurality of anodes; forming a mixture layer including at least two materials having different etch rates on the plurality of anodes; etching the mixture layer to form an irregular surface; forming a step difference compensation layer including a portion of the irregular surface in regions between the plurality of anodes; and forming an organic light emitting layer on the plurality of anodes, in which the step difference compensation layer includes a base layer, and a plurality of spike patterns disposed on the base layer, the plurality of spike patterns including protrusions that extend into at least a portion of the organic light emitting layer in a region between at least two adjacent anodes among the plurality of anodes.

According to an aspect of an embodied of the present disclosure, the forming the step difference compensation layer includes selectively removing the irregular surface from upper surfaces of the plurality of anodes.

Additional advantages and features of the embodiments of the invention will be set forth in part in the description which follows and in part will become apparent to those having ordinary skill in the art upon examination of the following or may be learned from practice of embodiments of the invention. The objectives and other advantages of the embodiments of the invention may be realized and attained by the structure particularly pointed out in the written description and claims hereof as well as the appended drawings.

It is to be understood that both the foregoing general description and the following detailed description of the embodiments of the present invention are by example and explanatory and are intended to provide further explanation of the embodiments of the present invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
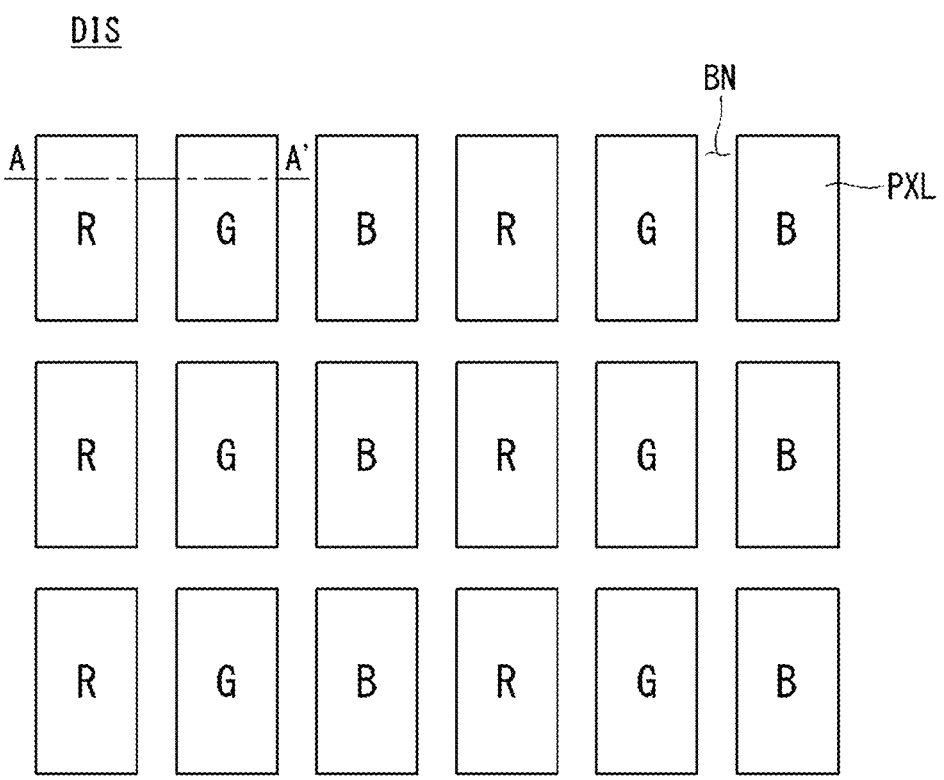
FIG. 1 and FIG. 2, including (a) and (b), are respectively a plan view and a cross-sectional view of an organic light emitting diode display device according to embodiments of the present disclosure.

Hereinafter, embodiments of the present disclosure will be described in detail with reference to the accompanying drawings. Like reference numerals designate like elements throughout the description. In the following description, when a detailed description of well-known functions or configurations related to this document is determined to unnecessarily cloud a gist of the invention, the detailed description thereof will be omitted. In describing the various embodiments, the same components may be described at the outset and may be omitted in other embodiments.

The terms "first," "second," etc. may be used to describe various components, but the components are not limited by such terms. These terms are only used to distinguish one component from another component.

Figure 2:
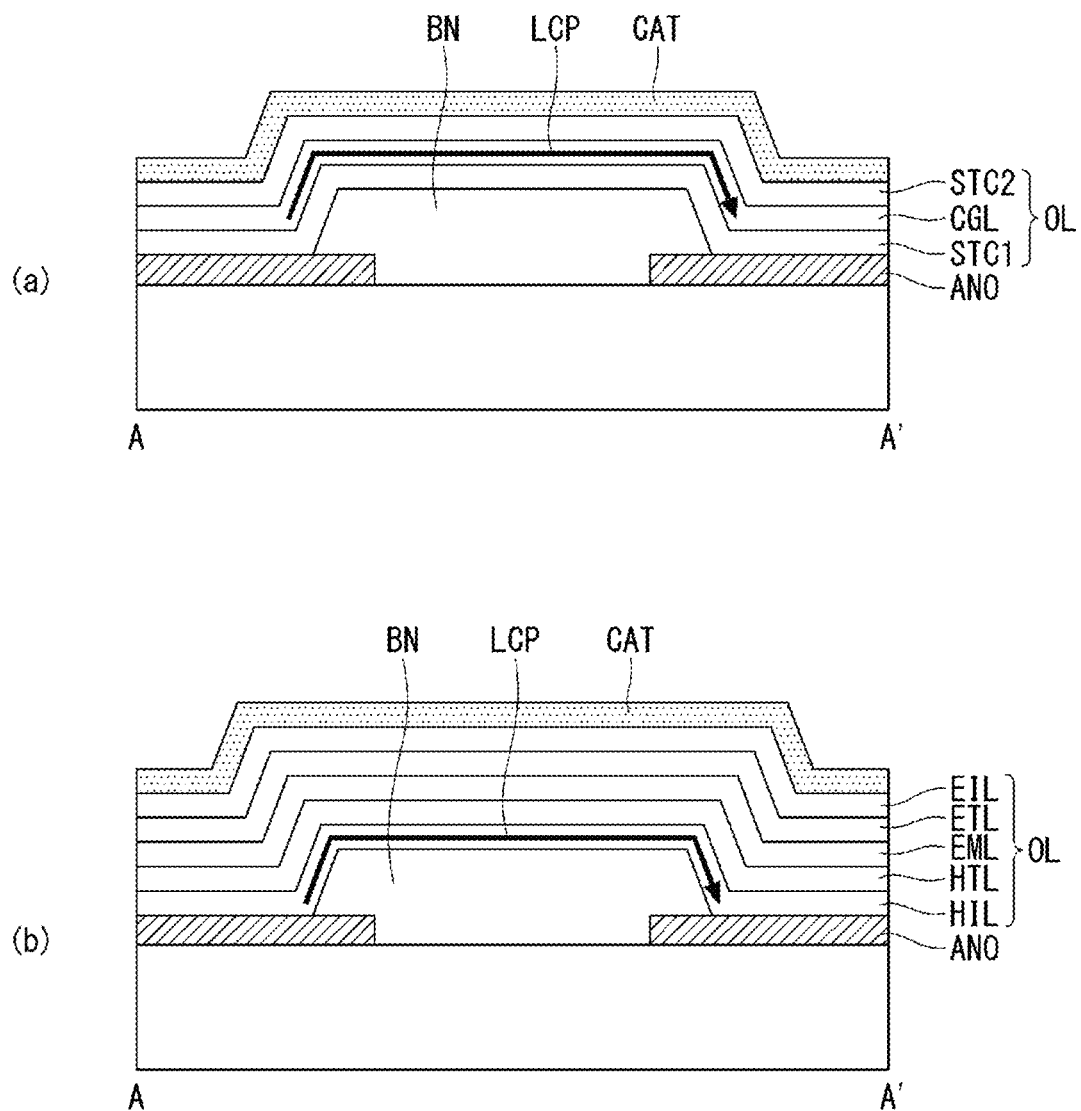
Figure 3:
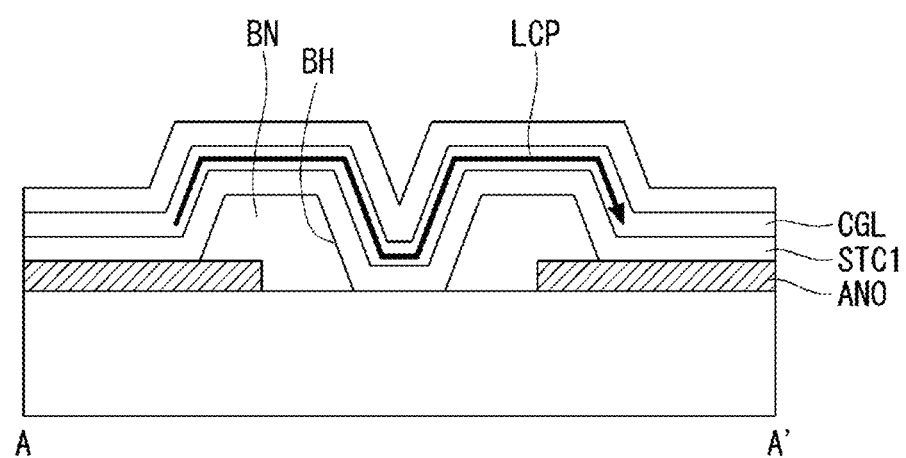
FIGS. 3 to 5 are views illustrating potential problems of an organic light emitting diode display device.
Figure 4:
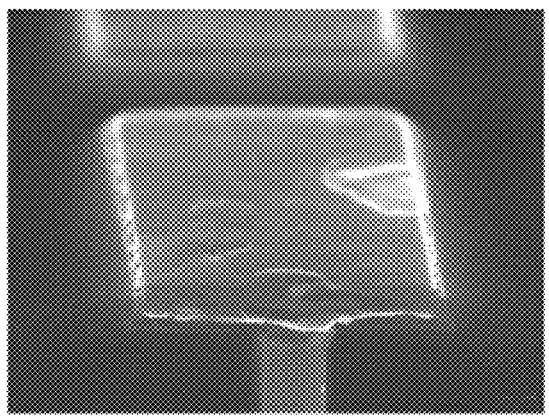
Figure 4:
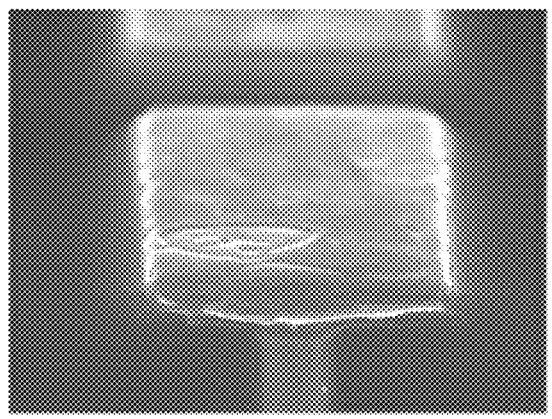
Figure 4:
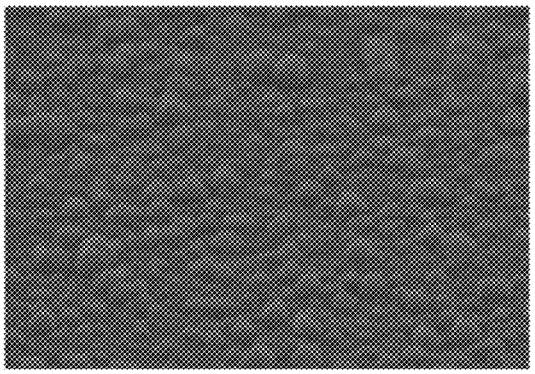
Figure 4:
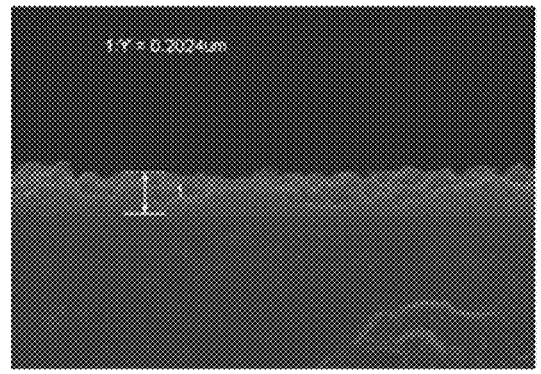
Figure 5:
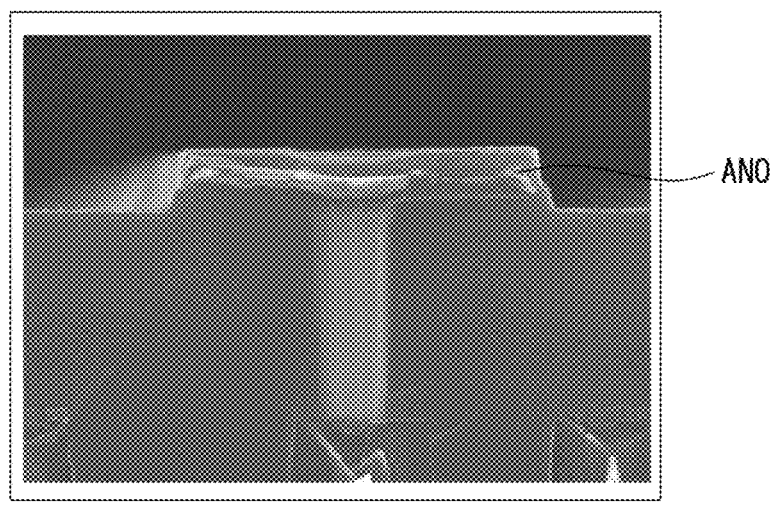
Figure 5:
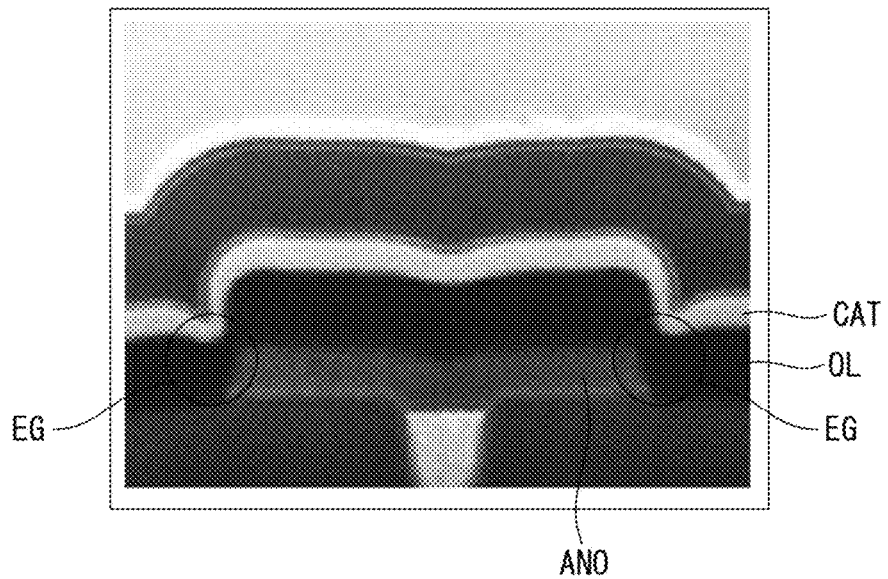

FIG. 1 and FIG. 2, including (a) and (b), are respectively a plan view and a cross-sectional view of an organic light emitting diode display device according to embodiments of the present disclosure. FIGS. 3 to 5 are views illustrating potential problems of an organic light emitting diode display device.

Referring to FIGS. 1 and 2, an organic light emitting diode display device includes a display panel DIS having a plurality of pixels PXL. The display panel DIS can have various shapes. That is, the display panel DIS can have a rectangular shape, a square shape, or various free forms such as a circle, an ellipse, or a polygon.

The display panel DIS includes red R, blue B, and green G pixels PXL emitting red R, blue B, and green G, respectively. Also, the display panel DIS can further include a pixel PXL that emits a different color such as white W. Hereinafter, for convenience of explanation, a situation where the display panel DIS includes red R, blue B, and green G pixels PXL will be described as an example.

The organic light emitting diode display device according to the present disclosure includes an organic light emitting layer OL for emitting white W and color filters for red R, blue B, and green G to implement red R, green G, and blue B. That is, in the organic light emitting diode display device, the white W light emitted from the organic light emitting layer OL passes through the color filters for red R, green G, and blue B provided in regions corresponding to the red R, green G, and blue B pixels PXL, so that it can implement red R, green G, and blue B.

In the organic light emitting diode display device according to the present disclosure, since it is sufficient to form the organic light emitting layer OL which emits white W to cover most of an entire surface of the panel, it is not necessary to use an FMM mask to allocate each of the organic light emitting layers OL of red R, blue B, and green G within the corresponding pixels PXL. Therefore, the present disclosure has an advantage of preventing problems, for example, when a high resolution is implemented, a process yield is decreased, and the organic light emitting layer OL is not aligned, caused by using the FMM described above.

By using the above-described method, the present disclosure can implement a display device having a high resolution while minimizing decreases in the process yield. However, due to a leakage current through the organic light emitting layer OL which is not divided for each pixel PXL and is formed broadly (e.g., as a common layer), light from an undesired pixel PXL may be emitted and color mixture may occur between neighboring pixels PXL. Here, at least one of layers constituting the organic light emitting layer OL having high conductivity may be a path that allows the flow of leakage current (LCP, FIG. 2).

For example, referring to (a) of FIG. 2, the organic light emitting layer OL that emits white W can have a multi-stack structure such as a two-stack structure. The two-stack structure can include a charge generation layer CGL disposed between a first electrode ANO and a second electrode CAT, and a first stack STC1 and a second stack STC2 disposed below and above the charge generation layer CGL with the charge generation layer CGL interposed therebetween. Hereinafter, a situation where the first electrode ANO is an anode and the second electrode CAT is a cathode will be described as an example, but the present disclosure is not limited thereto. That is, an organic light emitting diode can be implemented in an inverted structure.

Each of the first stack STC1 and the second stack STC2 includes an emission layer and can further include at least one of common layers such as a hole injection layer, a hole transport layer, an electron transport layer, and an electron injection layer. The emission layer of the first stack STC1 and the emission layer of the second stack STC2 can include light emitting materials of different colors from each other. Either the emission layer of the first stack STC1 or the emission layer of the second stack STC2 can include a blue light emitting material and the other can include a yellow light emitting material. However, the present disclosure is not limited thereto.

Since the above-described organic light emitting layer OL, in particular, the charge generation layer CGL is widely formed without being patterned for each pixel PXL, some current generated when the display device maintains an ON-state can be leaked through the charge generation layer CGL. There arises a problem that a color gamut (or, color reproduction range) is significantly decreased as the light is emitted from a pixel which is erroneously activated due to the leakage current LCP.

As another example, referring to (b) of FIG. 2, the organic light emitting layer OL emitting white W can have a single-stack structure. The single-stack structure includes an emission layer EML and can further include at least one of common layers such as a hole injection layer HIL, a hole transport layer HTL, an electron transport layer ETL, and an electron injection layer EIL.

Since the above-described organic light emitting layer OL, in particular, the hole injection layer HIL is widely formed without being patterned for each pixel PXL (e.g., formed as a common layer), some current generated when the display device maintains an ON-state can be leaked through the hole injection layer HIL. There arises a problem that a color gamut is significantly decreased as the light is emitted from the pixel PXL in which light emission is not required due to the leakage current.

Hereinafter, for convenience of explanation, a situation where the organic light emitting layer has a two-stack structure will be described as an example.

The above problem is further problematic in a high-resolution display device in which a distance between the pixels PXL is relatively reduced. That is, the neighboring pixels PXL are partitioned by a pixel defining layer such as a bank BN and spaced apart by a predetermined distance. However, since the distance is significantly reduced for the high-resolution display device, an incidence of color mixture defects due to the leakage current is inevitably increased. Therefore, in order to prevent deterioration of display quality in the high-resolution display device, it is necessary to restrict a flow of the leakage current between adjacent pixels.

As a method for restricting the flow of the leakage current, a method of ensuring a sufficiently long path of the leakage current may be considered. For example, referring to FIG. 3, a method of forming a bank groove BH in the bank BN may be considered. In this instance, since the charge generation layer CGL, which is a flow path of the leakage current, is also deposited along a stepped portion provided by the bank groove BH, a relatively long flow path of the leakage current can be ensured. However, as described above, in the high-resolution display device, since the distance between the neighboring pixels is very close, it is practically difficult to form the bank groove BH by patterning the bank BN formed of a single organic material between the neighboring pixels.

Further, in order to pattern the bank BN and the bank groove BH into a predetermined shape, an etching process is required. Since the bank BN is formed after the anode ANO is formed, an etching solution used in the patterning of the bank BN damages a top surface of the anode ANO, thereby causing a change in surface morphology of the anode ANO. That is, as shown in FIG. 4, the anode ANO does not maintain a uniform surface state, and is deformed by the etching solution, which results in a non-uniform surface state.

In this instance, the organic light emitting layer OL disposed on the anode ANO is also non-uniformly deposited, so that a short circuit occurs between the anode ANO and the charge generation layer CGL and/or between the charge generation layer CGL and the cathode CAT. Therefore, at least one of the stacks STC1 or STC2 might not emit light, or some generated current may leak through the charge generation layer CGL, so that a luminance of the pixel may be significantly decreased. Alternatively, even if the short circuit does not occur, there is a specific region in which the distance between the anode ANO and the charge generation layer CGL and/or between the charge generation layer CGL and the cathode CAT becomes very close. Therefore, there is a problem that the luminance of the pixel is significantly decreased because the specific region is a leakage path of the current. That is, some generated current when the pixel maintains an ON-state may leak through the charge generation layer CGL in the specific region, so that the luminance of the pixel may be significantly decreased.

Further, in implementing the high-resolution display device, due to process limitations, for example, limitations of resolution of process equipment, it is difficult to form the bank BN between the neighboring pixels. Furthermore, since the bank BN is formed to cover a part of an end portion of the anode ANO (e.g., the bank BN overlaps an edge of the anode ANO), an aperture ratio of the pixel is reduced since it is partially covered by the bank BN.

Referring to FIG. 5, a method of removing the bank BN can be considered in order to ensure a sufficient aperture ratio while implementing a high resolution. However, in this instance, since a stepped portion provided by the anode ANO is not compensated by the bank BN, the organic light emitting layer OL formed after the anode ANO is formed is also deposited along the stepped portion provided by the anode ANO. As described above, when the organic light emitting layer OL is formed to have the stepped portion, the organic light emitting layer OL may not be formed with a uniform thickness, but can be formed with a different thickness depending on a position. That is, referring to FIG. 5, it can be seen that the organic light emitting layer OL is formed very thinly at an edge portion EG of the anode ANO as compared with other regions.

In this instance, as a short circuit occurs between the anode ANO and the charge generation layer CGL and/or between the charge generation layer CGL and the cathode CAT at the edge portion EG of the anode ANO, at least one of the stacks may not emit light or some generated current may leak through the charge generation layer CGL, so that the luminance of the pixel may be significantly decreased. Alternatively, even if the short circuit does not occur, there is a region of the edge portion EG in which the distance between the anode ANO and the charge generation layer CGL and/or between the charge generation layer CGL and the cathode CAT is very close. Therefore, there is a problem that the luminance of the pixel is significantly decreased because the region of the edge portion EG is a leakage path of the current. That is, some current generated when the pixel maintains an ON-state may leak through the charge generation layer CGL in the region, so that the luminance of the pixel may be significantly decreased.

In order to solve the above problems, an embodiment of the present disclosure proposes a novel step difference compensation layer structure capable of effectively suppressing the leakage current and a method of manufacturing for forming the novel step difference compensation layer.

Figure 6:
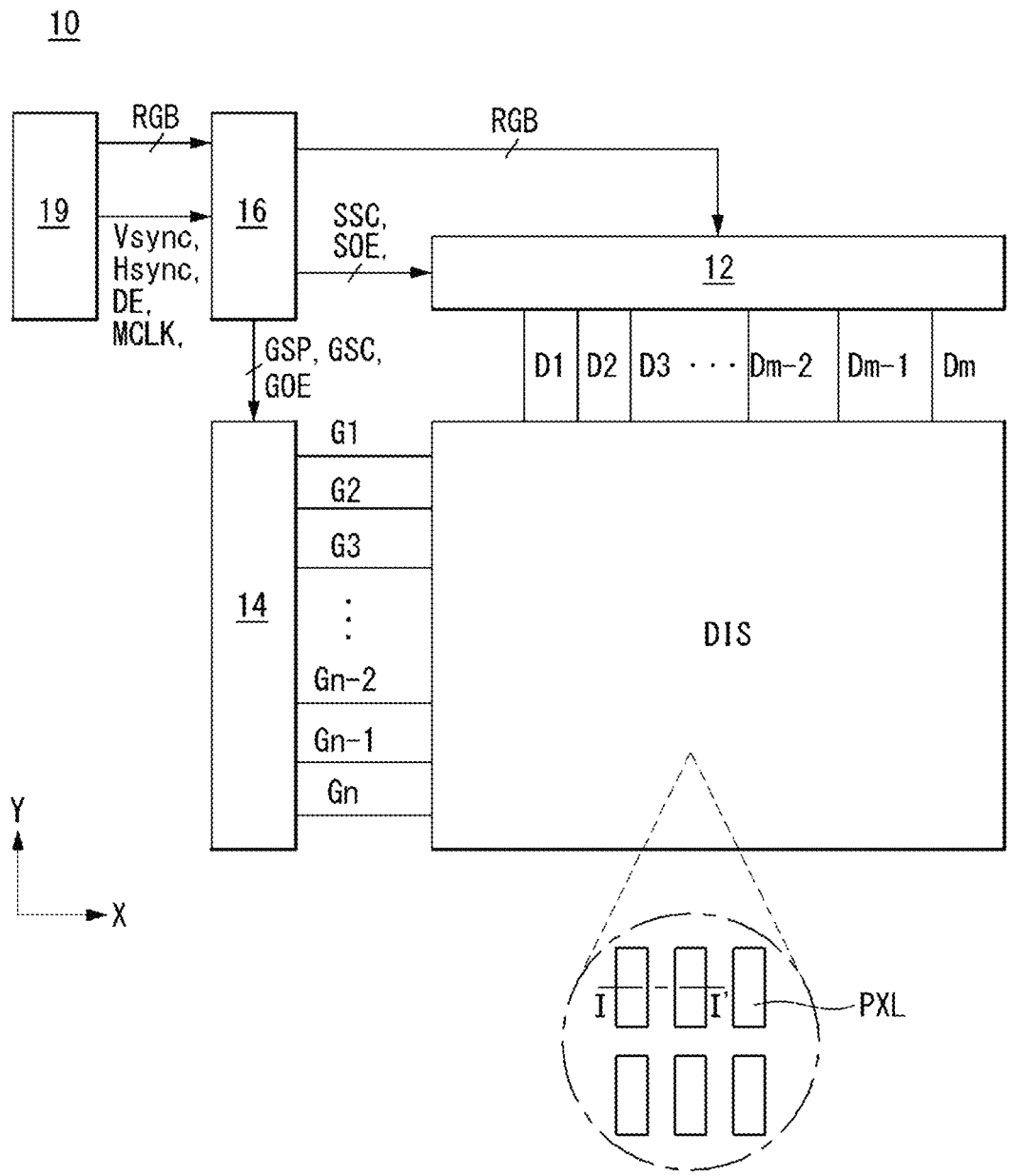
FIG. 6 is a block diagram schematically illustrating an organic light emitting diode display device according to an embodiment of the present disclosure.
Figure 7:
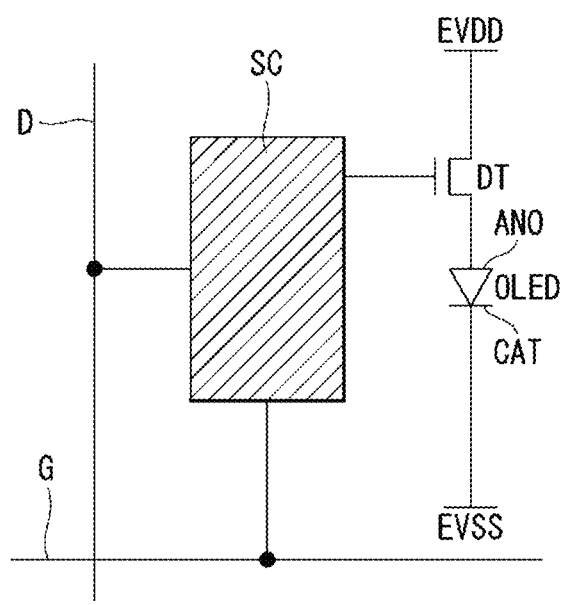
FIG. 7 is a schematic diagram illustrating a pixel shown in FIG. 6 according to an embodiment of the present disclosure.
Figure 8:
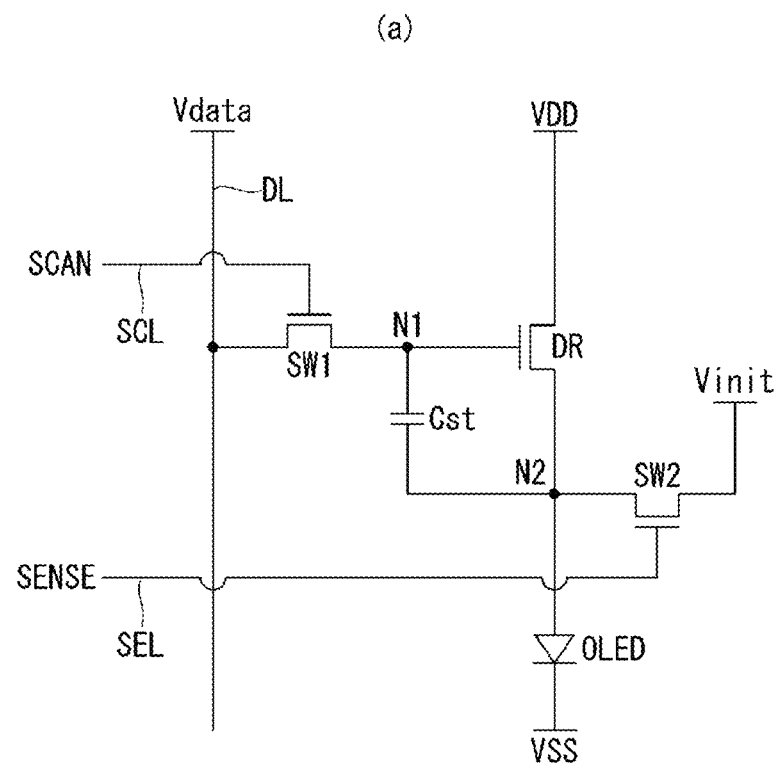
FIG. 8, including (a) and (b), is a view showing example circuits of FIG. 7 according to embodiments of the present disclosure.
Figure 8:
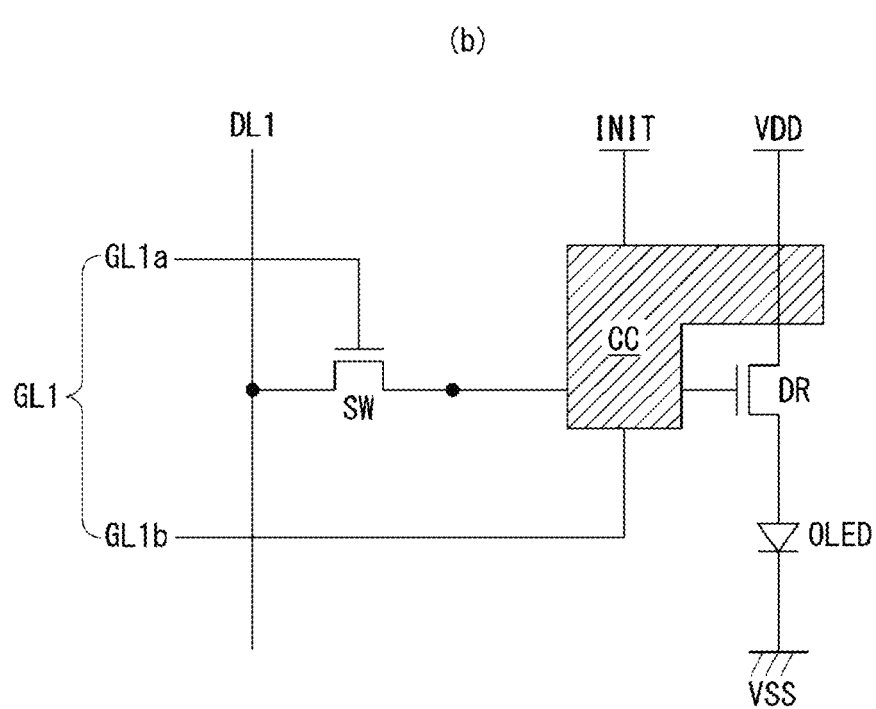
Figure 9:
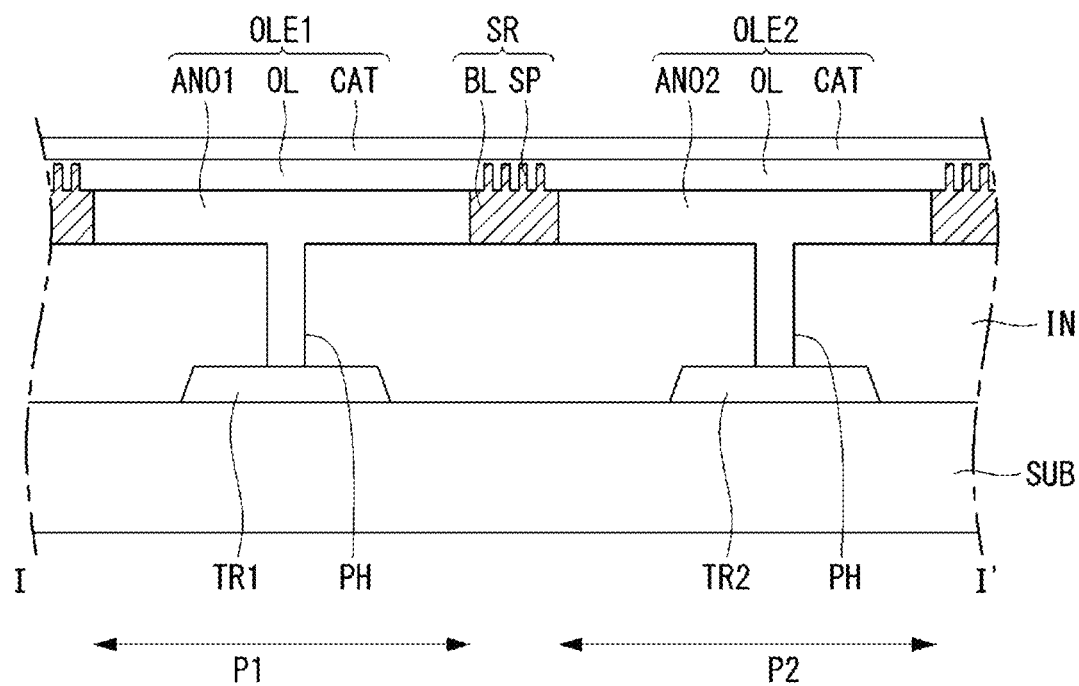
FIG. 9 is a cross-sectional view schematically illustrating a structure of two neighboring pixels according to an embodiment of the present disclosure.
Figure 10:
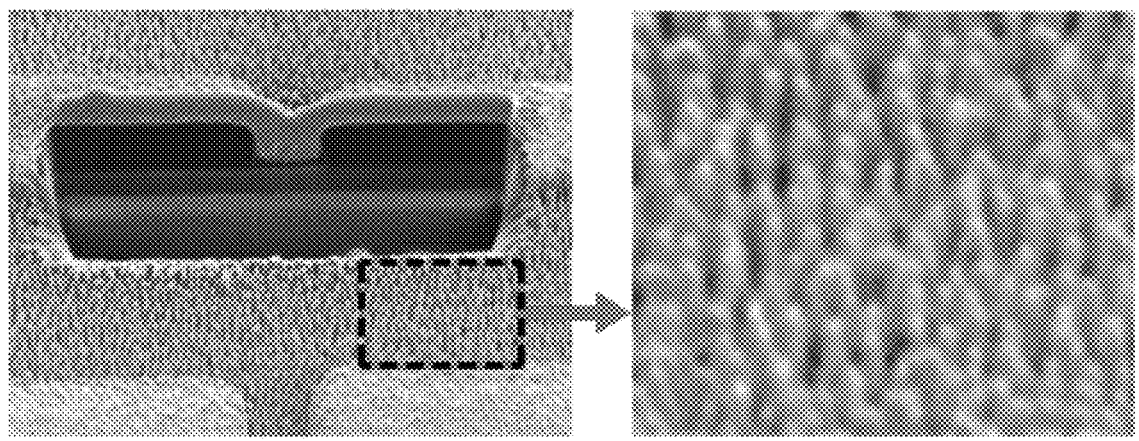
FIG. 10 is a real-life image showing a shape of a spike pattern according to an embodiment of the present disclosure.
Figure 11:
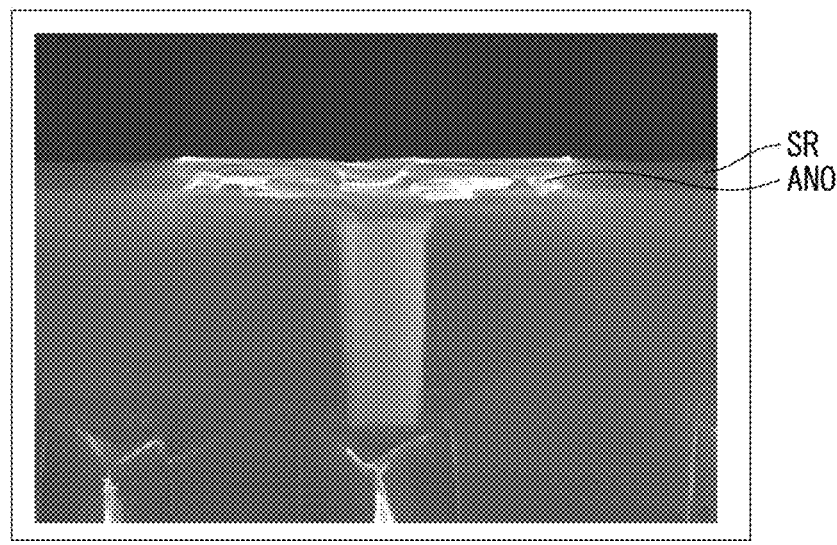
FIGS. 11 and 12 are views illustrating a function of a step difference compensation layer according to an embodiment of the present disclosure.
Figure 11:
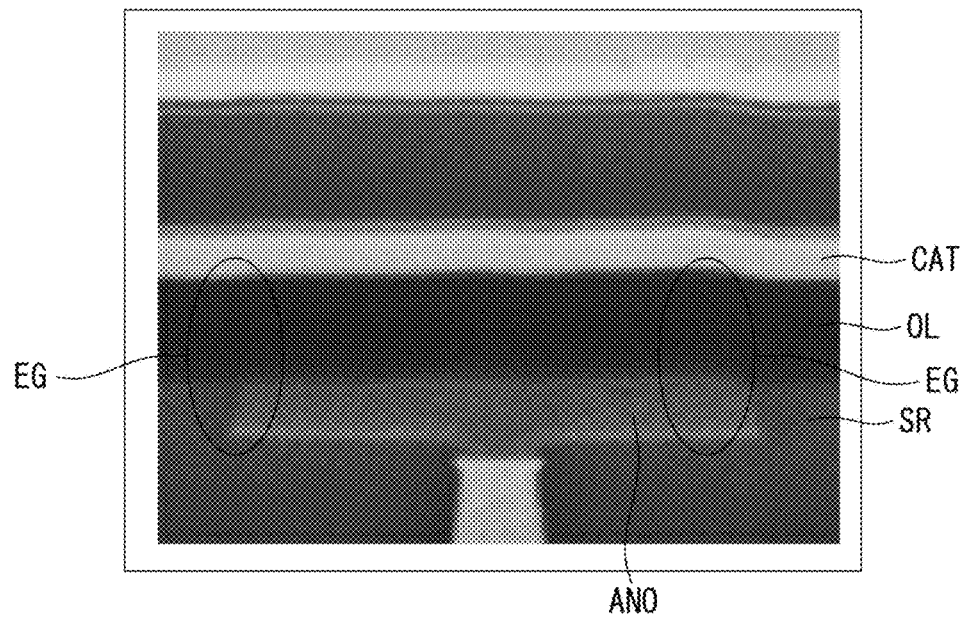
Figure 12:
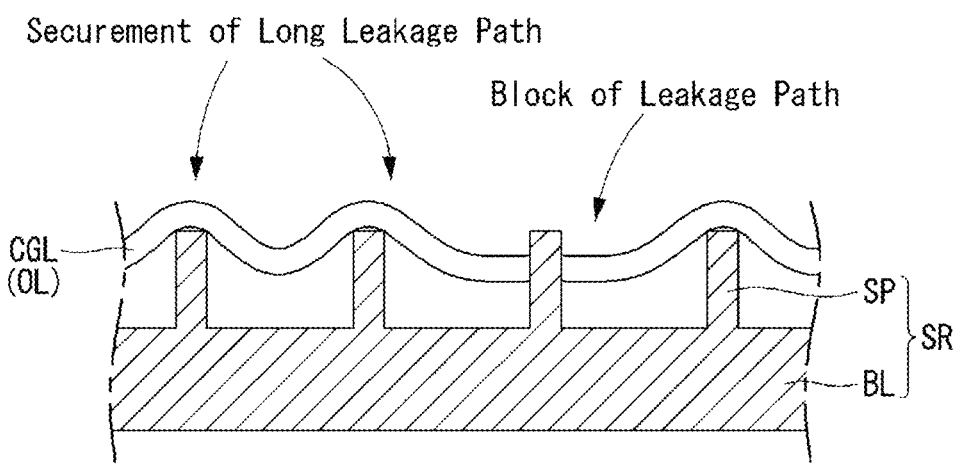

FIG. 6 is a block diagram schematically illustrating an organic light emitting diode display device according to an embodiment of the present disclosure. FIG. 7 is a schematic diagram illustrating a pixel shown in FIG. 6 according to an embodiment of the present disclosure. FIG. 8, including (a) and (b), illustrates example circuits of FIG. 7 according to embodiments of the present disclosure. FIG. 9 is a cross-sectional view schematically illustrating a structure of two neighboring pixels according to an embodiment. FIG. 10 is a real-life image showing a shape of a spike pattern according to an embodiment of the present disclosure. FIGS. 11 and 12 are views illustrating a function of a step difference compensation layer according to embodiments of the present disclosure.

Referring to FIG. 6, an organic light emitting diode display device 10 according to the present disclosure includes a display driving circuit and a display panel DIS.

The display driving circuit includes a data driver 12, a gate driver 14, and a timing controller 16, and writes a video data voltage of an input image to pixels PIX of the display panel DIS. The data driver 12 converts digital video data RGB input from the timing controller 16 into an analog gamma compensation voltage to generate a data voltage. The data voltage output from the data driver 12 is supplied to data lines D1 to Dm. The gate driver 14 sequentially supplies a gate signal synchronized with the data voltage to gate lines G1 to Gn to select the pixels of the display panel DIS to which the data voltage is written.

The timing controller 16 receives a timing signal such as a vertical synchronizing signal Vsync, a horizontal synchronizing signal Hsync, a data enable signal DE and a main clock MCLK, and the like input from a host system 19, and synchronizes operation timing of the data driver 12 and the gate driver 14. Data timing control signals for controlling the data driver 12 include a source sampling clock SSC, a source output enable signal SOE, and the like. Gate timing control signals for controlling the gate driver 14 include a gate start pulse GSP, a gate shift clock GSC, a gate output enable signal GOE, and the like.

The host system 19 can be implemented as any one of a television system, a set-top box, a navigation system, a DVD player, a Blu-ray player, a personal computer (PC), a home theater system, and a phone system. The host system 19 includes a system on chip (SoC) with an embedded scaler to convert the digital video data RGB of the input image into a format suitable for displaying on the display panel DIS. The host system 19 transmits the timing signals Vsync, Hsync, DE, and MCLK together with the digital video data to the timing controller 16.

The display panel DIS can have various planar shapes. That is, the display panel DIS can have a rectangular shape, a square shape, or planar shapes of various free forms such as a circle, an ellipse, or a polygon.

The display panel DIS includes a pixel PXL array. The pixel PXL array includes a plurality of pixels PXL. Each of the pixels PXL can be defined by an intersection structure of the data lines D1 to Dm, m is a positive integer, and the gate lines G1 to Gn, n is a positive integer, but it is not limited thereto. Each of the pixels PXL includes an organic light emitting diode (OLED), which is a self light emitting element. The display panel DIS includes red R, blue B, and green G pixels PXL emitting red R, blue B, and green G.

The pixel PXL can have various shapes. That is, the pixel PXL can have various planar shapes such as a circle, an ellipse, and a polygon. Any one of the pixels PXLs can have a different size and/or planar shape from other pixels among the pixels PXLs.

Referring further to FIG. 7, in the display panel DIS, a plurality of data lines D intersect with a plurality of gate lines G in intersecting areas, and pixels are arranged in a matrix form in each of the intersecting areas. Each of the pixels includes an organic light emitting diode OLED, a driving thin film transistor DT for controlling an amount of a current flowing through the organic light emitting diode OLED, and a programming unit SC for setting a gate-source voltage of the driving thin film transistor DT.

The programming unit SC can include at least one switching thin film transistor and at least one storage capacitor. The switching thin film transistor is turned on in response to a gate signal from the gate line G to apply a data voltage from a data line D to one electrode of the storage capacitor. The driving thin film transistor DT controls the amount of the current supplied to the organic light emitting diode OLED depending on a magnitude of a voltage charged in the storage capacitor to control an amount of light emitted from the organic light emitting diode OLED. The amount of light emitted from the organic light emitting diode OLED is proportional to the amount of the current supplied from the driving thin film transistor DT. Each of the pixels is connected to a high level power source EVDD and a low level power source EVSS, and are supplied with a high level power supply voltage and a low level power supply voltage from a power generator. Thin film transistors constituting a pixel PXL can be implemented as a p-type or an n-type. In addition, a semiconductor layer of the thin film transistors constituting the pixel PXL can include amorphous silicon, polysilicon, or an oxide. Hereinafter, a situation where the semiconductor layer includes the oxide will be described as an example. The organic light emitting diode OLED includes an anode electrode ANO, a cathode electrode CAT, and an organic light emitting layer interposed between the anode electrode ANO and the cathode electrode CAT. The anode electrode ANO is connected to the driving thin film transistors DT.

Referring to (a) of FIG. 8, the pixel according to the embodiment includes a driving transistor DR, first and second switching transistors SW1 and SW2, and a capacitor Cst. The organic light emitting diode OLED operates to emit light depending on a driving current formed by the driving transistor DR. The first switching transistor SW1 supplies a data voltage Vdata supplied through a data line DL to a first node N1 in response to a gate signal SCAN supplied through a gate line SCL. The driving transistor DR operates so that the driving current flows between a high level power supply wiring VDD and a low level power supply wiring VSS depending on the data voltage stored in the capacitor Cst. The second switching transistor SW2 connects a second node N2 and an initial wiring in response to a sense signal SENSE supplied through a sense wiring SEL. The initial wiring is connected to an input terminal of an initial voltage Vinit or to an analog-to-digital converter (ADC) which obtains a sensing value that senses a threshold voltage of the driving transistor DR.

As shown in (b) of FIG. 8, the pixel PXL can include an internal compensation circuit CC. The internal compensation circuit CC can include one or more transistors, thus, a gate line GL1 includes a signal line GL1*b* for supplying a gate signal for controlling the transistors of the internal compensation circuit CC. The gate line GL1 can further include a signal line GL1*a* for controlling a switching transistor SW. The internal compensation circuit CC sets a gate-source voltage of a driving transistor DR to a voltage on which the threshold voltage is reflected, so that it excludes a change in luminance due to the threshold voltage of the driving transistor DR when the organic light emitting diode OLED emits light.

A structure of the pixel of the present disclosure is not limited to this, and can be variously composed of 2T (Transistor) 1C (Capacitor), 3T1C, 4T2C, 5T2C, 6T2C, 7T2C and the like.

Referring to FIG. 9, an organic light emitting diode display device, according to an embodiment of the present disclosure, includes a thin film transistor substrate SUB. For example, the substrate SUB can be a silicon based substrate or a glass substrate. Thin film transistors TR1 and TR2 allocated to each of pixels P1 and P2 and organic light emitting diodes OLE1 and OLE2 connected to the thin film transistors TR1 and TR2 are disposed on the thin film transistor substrate SUB. Neighboring pixels P1 and P2 can be partitioned by a step difference compensation layer SR.

The thin film transistors TR1 and TR2 can be implemented in various structures such as a bottom gate, a top gate, and a double gate structure. That is, the thin film transistors TR1 and TR2 can include a semiconductor layer, a gate electrode, and a source/drain electrode, and the semiconductor layer, the gate electrode, and the source/drain electrode can be disposed on different layers with at least one insulating layer interposed therebetween.

One or more insulating layer IN can be interposed between the thin film transistors TR1 and TR2 and the organic light emitting diodes OLE1 and OLE2. The insulating layer IN is made of an organic material such as photo acryl, polyimide, benzocyclobutene resin, acrylate resin, and can planarize an upper surface of the substrate SUB on which the thin film transistor is formed. The thin film transistors TR1 and TR2 and the organic light emitting diodes OLE1 and OLE2 can be electrically connected through a pixel contact hole PH passing through one or more insulating layer IN.

The organic light emitting diodes OLE1 and OLE2 include anodes ANO1 and ANO2, a cathode CAT opposite to each other, and an organic light emitting layer OL interposed between the anodes ANO 1, ANO 2 and the cathode CAT.

The anodes ANO1 and ANO2 can be composed of a single layer or a multilayer. The anodes ANO1 and ANO2 can further include a reflective layer to function as a reflective electrode. The reflective layer can be made of aluminum (Al), copper (Cu), silver (Ag), nickel (Ni) or an alloy thereof, preferably silver/palladium/copper (APC) alloy. For example, the anodes ANO1 and ANO2 can be formed of a triple layer of ITO/Ag/ITO. In this instance, the lower ITO can be formed for the purpose of improving adhesion property between an organic layer (planarization layer) and Ag. The anodes ANO1 and ANO2 can be divided to correspond to the pixels P1 and P2, respectively, and allocated as one for each pixel P1 and P2. The step difference compensation layer SR is provided between neighboring anodes ANO1 and ANO2.

The cathode CAT can be made of a transparent conductive material such as Indium Tin Oxide (ITO), Indium Zinc Oxide (IZO) or Zinc Oxide (ZnO), or can be formed thinly of an opaque conductive material such as magnesium (Mg), calcium (Ca), aluminum (Al), and silver (Ag) to function as a transmission electrode. The cathode CAT can be integrally extended to be disposed on the thin film transistor substrate SUB to cover the pixels P1 and P2.

The organic light emitting layer OL is disposed on the thin film transistor substrate SUB to cover the pixels P1 and P2. The organic light emitting layer OL can have a multi-stack structure such as a two-stack structure. The two-stack structure can include a charge generation layer CGL disposed between an anode ANO and a cathode CAT, and a first stack STC1 and a second stack STC2 disposed below and above the charge generation layer CGL with the charge generation layer CGL interposed therebetween. Each of the first stack STC1 and the second stack STC2 includes an emission layer and can further include at least one of common layers such as a hole injection layer, a hole transport layer, an electron transport layer, and an electron injection layer. The emission layer of the first stack STC1 and the emission layer of the second stack STC2 can include light emitting materials of different colors from each other.

Further referring to FIG. 10, the step difference compensation layer SR includes a base layer BL and a plurality of spike patterns SP formed on the base layer BL. The spike patterns SP have protrusion shapes extending from the base layer BL and protruding outwardly. The step difference compensation layer SR can have an irregular upper surface due to the spike patterns SP. In other words, the upper surface of the step difference compensation layer SR can have a fine concave-convex structure due to the spike patterns SP. The spike patterns SP can have an irregular shape. That is, any one spike pattern SP can have a different height and/or width from another spike pattern SP (e.g., the spike pattern SP can include a plurality of protrusions that can be finger shaped or villus shaped, and spaced closely together similar to villi). For example, the protrusions can have slightly different heights and/or widths. Also, the base layer can have substantially a same height as the anodes.

The spike pattern SP can be formed to have substantially the same height as the anodes ANO1 and ANO2 to compensate the step difference of the anode ANO1 and ANO2. For example, upper surfaces of the plurality of spike patterns can be substantially flush, even or level with upper surfaces of the two adjacent anodes. As will be described later, it is preferable that the spike pattern SP is formed to protrude further above a surface of the anode ANO1 and ANO2 in order to separate a layer which becomes a leakage path of a current on the step difference compensation layer SR.

The step difference compensation layer SR comprises at least two kinds of materials having an etch selectivity difference. The step difference compensation layer SR can be made of a mixed material which is mixed with at least two kinds of materials having an etch selectivity difference under the same process conditions. In other words, the step difference compensation layer SR can be formed by mixing the materials having different etch rates. The spike pattern SP of the step difference compensation layer SR can be made of a material having a low etch rate among the materials having different etch rates.

The mixture for forming the step difference compensation layer SR can be composed of a binder which becomes a skeleton in the mixture, and an additive. The binder can include a high molecular substance of an acryl-based or epoxy-based. For example, the step difference compensation layer SR can include non-conductive materials. The additive can be selected as a low molecular substance having a lower etch rate than the binder. In one example, the additive can include an organic material of a lactam-based. The additive can be preferably a black pigment. An embodiment of the present disclosure has the base layer including the black pigment, which can reduce external light reflection and has an advantage that a viewing angle can be improved. The spike pattern SP of the step difference compensation layer SR can be a shape implemented by removing the additive at the position and leaving the binder.

Further referring to FIG. 11, the step difference compensation layer SR is disposed between the neighboring anodes ANO1 and ANO2 to compensate a step difference provided by a self-thickness of the anode ANO1 and ANO2. Accordingly, the organic light emitting layer OL can be formed to have a uniform thickness on the anode ANO1 and ANO2 and the step difference compensation layer SR. That is, an embodiment of the present disclosure has the step difference compensation layer SR between the anodes ANO1 and ANO2, which has an advantage of preventing a problem that can occur in the structure in which the bank are removed as described with reference to FIG. 5. Furthermore, since the step difference compensation layer SR according to an embodiment of the present disclosure does not cover a part of the anodes ANO1 and ANO2 like a conventional bank structure, it has an advantage that a high aperture ratio can be ensured even in a high-resolution display device.

Also, as will be described later, since the step difference compensation layer SR according to an embodiment of the present disclosure can be formed without damaging the anodes ANO1 and ANO 2, it is possible to prevent a problem that can occur in the structure having the bank BN and the bank groove BH described with reference to FIGS. 3 and 4. Accordingly, when the pixels P1 and P2 remain ON-state, it is possible to minimize a problem that the luminance of the pixels P1 and P2 is significantly decreased because some of the generated current leaks through the charge generation layer. Further, when the pixels P1 and P2 remain in an ON-state, it is possible to minimize a problem that the organic light emitting diodes OLE1 and OLE2 do not emit light.

Further referring to FIG. 12, a surface of at least a part of layers constituting the organic light emitting layer OL can have a wave shape (or, wave front) on the step difference compensation layer SR (e.g., a surface of the organic light emitting layer OL can be wavy). Further, in at least a part of region on the step difference compensation layer SR, at least the part of the layers constituting the organic light emitting layer OL can be separated. That is, at least the part of the layers constituting the organic light emitting layer OL can be embedded between the spike patterns SP. At this time, an upper end of the spike patterns SP can protrude (or be exposed) above the surface of the part of the layers passing through the part of the layers (e.g., the spikes or protrusions can pierce through the layers that constitute the organic light emitting layer OL, in order to create an open circuit state or at least increase the surface area and/or electrical resistance of the organic light emitting layer OL in a region between adjacent pixels).

For example, an embodiment of the present disclosure includes a step difference compensation layer SR having a plurality of spike patterns SP having a predetermined height and width, so that it is possible to increase a surface area of the charge generation layer CGL which is disposed on the step difference compensation layer SR and becomes a path of a leakage current. For example, some of the spikes or protrusions can pierce through all of the layers that constitute the organic light emitting layer OL, or alternatively, some spikes or protrusions can pierce through only some of the layers that constitute the organic light emitting layer OL or only a single layer (e.g., the CGL, HIL, or HTL). For example, an upper portion of the organic light emitting layer OL can remain connected across adjacent anodes. Accordingly, since an embodiment of the present disclosure can ensure a sufficiently long leakage path of a current, it has an advantage to minimize a color mixture defect due to the leakage current.

In addition, an embodiment of the present disclosure controls the distance between the spike patterns SP, so that it is possible to separate the organic light emitting layer including the charge generation layer CGL on the step difference compensation layer SR. Thus, an embodiment of the present disclosure can block the leakage path of the current in at least a part of regions of an upper portion of the step difference compensation layer SR without any additional process, so that it is possible to further minimize the color mixture defect due to the leakage current.

An embodiment of the present disclosure can ensure the distance between the spike patterns SP to be 100 nm or more, so that it is possible to separate the charge generation layer CGL, which is a main leakage path of the current. That is, it is preferable to provide the step difference compensation layer SR having spike patterns SP, in order to block the leakage path of the current without performing any additional process, wherein the distance between neighboring spike patterns SP can be set to be 100 nm or more. Preferably, the distance between the spike patterns SP can be set between 100 nm and 200 nm. When the distance between the spike patterns SP is selected to be 200 nm or more, the charge generation layer CGL, which is the main leakage path of the current, may not be separated due to deposition along a step coverage of the spike patterns SP.

Hereinafter, a method of manufacturing an organic light emitting diode display device according to an embodiment of the present disclosure will be described with reference to FIGS. 13A to 13E. FIGS. 13A to 13E are views showing a manufacturing method according to an embodiment of the present disclosure in a time-series manner. In describing the manufacturing method according to a second embodiment of the present disclosure, steps are distinguished, but it is for convenience of description, and it should be noted that each step can be further subdivided. In the following description, the process of forming an organic light emitting diode and a step difference compensation layer SR, will be focused on in detail.

Figure 13A:
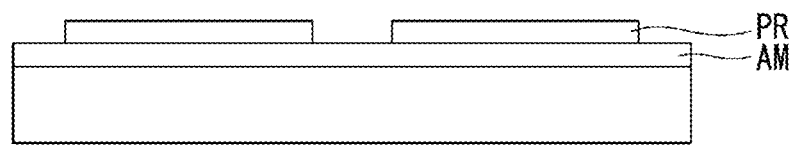
FIGS. 13A to 13E are views showing a manufacturing method according to an embodiment of the present disclosure.

Referring to FIG. 13A, a process of applying a conductive material AM for forming anodes ANO1 and ANO2 is performed on an entire surface of a substrate SUB on which thin film transistors are formed. When the anodes ANO1 and ANO2 are formed as a multilayer, the conductive materials AM constituting the multilayer can be sequentially applied. A photoresist PR made of a photosensitive material such as a photoresist is formed on the entire surface of the substrate SUB on which the conductive material AM is deposited. The photoresist PR is disposed in a region corresponding to a region where the anodes ANO1 and ANO2 electrode are to be formed.

Figure 13B:
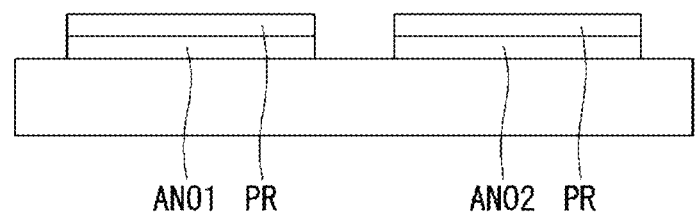

Referring to FIG. 13B, a process of forming the anodes ANO1 and ANO2 is performed by patterning the conductive material AM by a mask process. The anodes ANO1 and ANO2 can be assigned to each pixel. Also, the anodes ANO1 and ANO2 can be electrically connected to the thin film transistors through pixel contact holes passing through an insulating layer between the anodes ANO1 and ANO2 and the thin film transistors. Here, the photoresist PR remains without being removed.

Figure 13C:
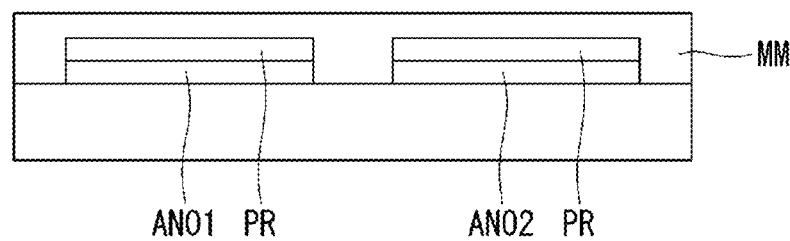

Referring to FIG. 13C, a process of applying (or coating) a mixture MM for forming a step difference compensation layer SR is performed on the substrate SUB on which the anodes ANO1 and ANO2 and the photoresist PR are formed. The mixture MM includes at least two kinds of materials having an etch selectivity difference. The mixture MM can be composed of a binder which becomes a skeleton in the mixture MM, and an additive.

Figure 13D:
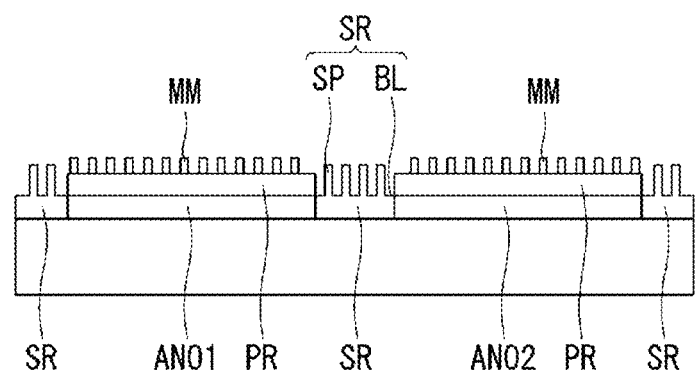

Referring to FIG. 13D, an etching process is performed on the substrate SUB applied with the mixture MM to form the step difference compensation layer SR having a base layer BL and spike patterns SP. More specifically, since the mixture MM contains at least two kinds of materials having different etch rates, a part removed by an etch rate difference and the remaining part can coexist in at least a portion of the mixture MM in contact with an etching solution during the etching process. That is, a dry etching process can be performed under predetermined conditions to form the step difference compensation layer SR having an irregular surface state. In the step difference compensation layer SR, a protruding part forming an irregular surface can be referred to as a spike pattern SP, and the other part can be referred to as a base layer BL.

A shape of the spike pattern SP can be different depending on a position. Neighboring spike patterns SP can be disposed to have a desired fine distance. In order to control a distance between the spike patterns SP, process conditions such as process times and process materials and the like can be appropriately selected. For example, a content ratio between the binder and the additive constituting the mixture MM for forming the step difference compensation layer SR can be controlled to control the distance between the neighboring spike patterns SP. That is, by increasing the content of the binder, which remains after the etching process to form the spike pattern SP, relative to the content of the additive, the distance between the neighboring spike patterns SP can be closed (e.g., made smaller) and vice versa. As another example, by appropriately selecting a material of the binder constituting the mixture MM for forming the step difference compensation layer SR, the distance between the neighboring spike patterns SP can be controlled. That is, by selecting a material, which is large in unit molecular size, as the binder, the distance between the neighboring spike patterns SP can be closed (e.g., made smaller) and vice versa.

An embodiment of the present disclosure performs an etching process using materials having different etch rates, so that it can implement a spike pattern SP that has a very fine distance between spikes or protrusions (e.g., similar to how villi are spaced apart), which could not be implemented by using a conventional mask process. Further, the embodiment of the present disclosure proceeds with the etching process for forming the spike pattern SP in a state where the photoresist PR is disposed on the anodes ANO1 and ANO2. Therefore, since the step difference compensation layer SR according to an embodiment of the present disclosure can be formed without damaging the anodes ANO1 and ANO2, it is possible to prevent a problem that may occur in the structure having the bank and the bank groove described with reference to FIG. 4. Thus, when the pixel maintains an ON-state, the organic light emitting diode does not emit light or some generated current leaks through the charge generation layer, so that there is an advantage that a problem that the luminance of the pixel is significantly decreased can be minimized.

Figure 13E:
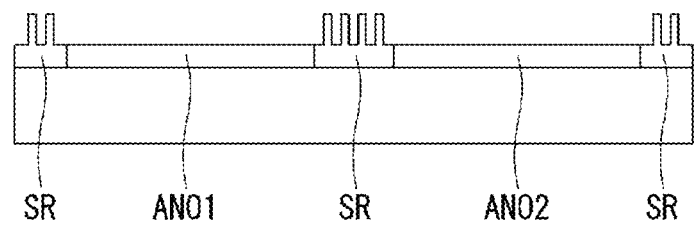

Referring to FIG. 13E, a process of removing the photoresist PR disposed on the anodes ANO10 and ANO2 proceeds. As the photoresist PR is removed, the mixture MM remaining on the photoresist PR is also removed. Accordingly, an embodiment of the present disclosure can provide the anodes ANO1 and ANO2 having no surface damage and having uniform surface characteristics.

In addition, an organic light emitting layer and a cathode are sequentially disposed on the entire surface of the substrate SUB on which the anodes ANO1 and ANO2 are formed. The organic light emitting layer and the cathode can be widely disposed on the substrate SUB to cover all of the pixels. An embodiment of the present disclosure includes the step difference compensation layer SR formed with a plurality of spike patterns SP having a predetermined height and width, so that a surface area of the charge generation layer, which is disposed on the step difference compensation layer SR and becomes a path of a leakage current, can be increased. Accordingly, since an embodiment of the present disclosure can ensure a sufficiently long leakage path of a current, it has an advantage that the color mixture defect due to the leakage current can be minimized.

In addition, an embodiment of the present disclosure controls the distance between spike patterns SP, so that it can separate or pierce through the organic light emitting layer including the charge generation layer, which is disposed on the upper part of the step difference compensation layer SR. Alternatively, some of the spike patterns SP can penetrate only partially into the organic light emitting layer (e.g., may only pierce through one or more lower layers of the organic light emitting layer, such HIL, HTL or CGL). Thus, since an embodiment of the present disclosure can block the leakage path of the current in at least a part of the upper part of the step difference compensation layer SR without further additional process, it is possible to further minimize the color mixture defect due to the leakage current.

The present disclosure removes the conventional bank structure and has the step difference compensation layer including two kinds of materials with different etch rates, so that the leakage current can be minimized while ensuring a sufficient aperture ratio in a high-resolution display device. Accordingly, the present disclosure can provide the organic light emitting diode display device with improved display quality.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device, comprising:
    a substrate;
    a plurality of pixels disposed on the substrate;
    a plurality of anodes corresponding to the plurality of pixels, respectively;
    an organic light emitting layer disposed on the plurality of anodes;
    a charge generation layer included in the organic light emitting layer;
    a cathode layer disposed on the organic light emitting layer; and
    a step difference compensation layer partitioning at least two adjacent pixels among the plurality of pixels,
    wherein the step difference compensation layer includes:
        a base layer, and
        a plurality of spike patterns disposed on the base layer, the plurality of spike patterns including protrusions that extend into at least a portion of the organic light emitting layer in a region between the at least two adjacent pixels,
    wherein the charge generation layer is disposed on the plurality of spiked patterns, and
    wherein the charge generation layer has a wavy surface in the region between the at least two adjacent pixels or at least one of the protrusions pierces through the charge generation layer in the region between the at least two adjacent pixels.

2. The organic light emitting diode display device of claim 1, wherein the plurality of spiked patterns are configured to block leakage current from flowing between the at least two adjacent pixels.

3. The organic light emitting diode display device of claim 1, wherein each of the protrusions in the plurality of spike patterns is finger shaped or villus shaped.

4. The organic light emitting diode display device of claim 1, wherein the protrusions in the step difference compensation layer are spaced apart from each other by a distance greater than or equal to approximately 100 nm.

5. The organic light emitting diode display device of claim 1, wherein the organic light emitting layer includes a plurality of layers, and
    wherein at least one of the protrusions pierces though at least one layer of organic light emitting layer.

6. The organic light emitting diode display device of claim 5, wherein an upper portion of the organic light emitting layer remains connected across the at least two adjacent pixels.

7. The organic light emitting diode display device of claim 1, wherein the step difference compensation layer has an irregular surface or an upper surface of the step difference compensation layer has a concave-convex structure.

8. The organic light emitting diode display device of claim 1, wherein the step difference compensation layer is disposed between two adjacent anodes among the plurality of anodes.

9. The organic light emitting diode display device of claim 8, wherein upper surfaces of the plurality of spike patterns are substantially flush with upper surfaces of the two adjacent anodes.

10. The organic light emitting diode display device of claim 8, wherein the plurality of spike patterns protrude farther than upper surfaces of the two adjacent anodes in a direction toward the organic light emitting layer.

11. The organic light emitting diode display device of claim 1, wherein the step difference compensation layer includes a mixture of at least two materials having different etch rates.

12. The organic light emitting diode display device of claim 11, wherein the mixture includes a binder and an additive,
    wherein the binder is acryl-based or epoxy-based, and the additive includes an organic material that is lactam-based, and
    wherein the additive in the step difference compensation layer includes a black pigment.

13. The organic light emitting diode display device of claim 1, wherein the step difference compensation layer is disposed between two adjacent anodes among the plurality of anodes without overlapping an upper surface of the two adjacent anodes.

14. The organic light emitting diode display device of claim 1, wherein the organic light emitting layer has a uniform thickness across the plurality of anodes.

15. The organic light emitting diode display device of claim 1, wherein portions of the organic light emitting layer are embedded between the protrusions in the plurality of spike patterns.

* * * * *